United States Patent
Lai et al.

(10) Patent No.: US 6,914,315 B2
(45) Date of Patent: Jul. 5, 2005

(54) GAN-BASED HETEROSTRUCTURE PHOTODIODE

(75) Inventors: Mu-Jen Lai, Hsinchu (TW); Chiung-Yu Chang, Hsinchu (TW)

(73) Assignee: Vtera Technology Inc., Hsinchu (TW)

( * ) Notice: Subject to any disclaimer, the term of this patent is extended or adjusted under 35 U.S.C. 154(b) by 0 days.

(21) Appl. No.: 10/447,434

(22) Filed: May 28, 2003

(65) Prior Publication Data

US 2004/0238912 A1 Dec. 2, 2004

(51) Int. Cl.[7] .............................................. H01L 21/00
(52) U.S. Cl. ...................... 257/458; 257/184; 257/190; 257/79; 257/99; 257/94; 257/103
(58) Field of Search ........................... 257/79–107, 458, 257/184, 190, 99, 101, 96, 98, 100, 183, 194, 195, 196; 438/48; 372/43–50

(56) References Cited

U.S. PATENT DOCUMENTS 6,667,498 B2 * 12/2003 Makimoto et al. .......... 257/183
6,674,097 B2 * 1/2004 Komoto et al. ............... 257/98

\* cited by examiner

*Primary Examiner*—Nathan J. Flynn
*Assistant Examiner*—Fazli Erdem
(74) *Attorney, Agent, or Firm*—Pro-Techtor International Services

(57) ABSTRACT

The present invention relates to a GaN-based heterostructure photodiode comprising a P type layer, an N type layer, and an activity layer between the P type layer and the N type layer. The P type layer, the N type layer and the activity layer are made of GaN-based composition, and the activity layer is doped with borons so as to modulate the band gap between the P type layer and the N type layer. Therefore, the breakdown voltage can be increased and the light receiving ability can be promoted so that the photodiode to be a light receiving element can has a better performance for light detection.

4 Claims, 6 Drawing Sheets

GAN-BASED HETEROSTRUCTURE PHOTODIODE

BACKGROUND OF THE INVENTION

1. Field of the Invention

The present invention relates to a semiconductor epitaxy structure, and particularly, to a GaN-based heterostructure photodiode. By doping borons in the activity layer of the PIN photodiode (PIN PD), the band gap between the P type layer and the N type layer will be modulated so as to promote the light receiving ability.

2. Description of the Prior Art

The GaN-based composition semiconductor is mainly used for making the diode, such as light emitting diode (LED), laser diode (LD), high frequency/high power transistor and photodiode.

Generally, in the structure of the diode, an activity layer is formed on the junction between the P type and N type layers. When the activity layer is additionally positioned on the junction between the P type and N type layers, the structure will be called as a PIN photodiode (PIN PD). For the vertical design of the structure, the PIN diode comprises a homojunction structure, a heterojunction structure, and a quantum well structure. The heterostructure is often used for control the band gap depending on the properties itself.

The photodiode can transform a photo signal into an electric signal with low consumption. Therefore, the photodiode is suitable for being a light-receiving element to be used in the applications of light detection and light communication. For example, the photodiode can be used as a light-receiving element of a mouse, a photo coupler, a photo discontinuation/continuation, a remote controller, or a wireless transmission device. The reason for the photodiode can be a light detection device is that when the photons with energy greater than the band gap of the material are irradiated on the empty area of the diode, the originally-combined electron and electric hole will be separated because the electric forces exerted on them are opposite to each other. And the separated electrons and electric holes will separately flow into the P type and N type junction areas so as to form photo current. By being connected to an outside current amplifier, the photo current can be accurately measured wherein the magnitude of the photo current is directly proportional to the absorbed photons. Therefore, how to promote the light receiving ability of the photodiode by changing the band gap of the heterostructure is an important subject to be researched and developed in the related technology field. However, in the prior art, the technology for modulating the band gap of the photodiode is imperfect so that the light receiving ability is insufficient and the performance of the GaN photodiode element is poor.

Therefore, in order to resolve the mentioned problems, the present invention is provided to dope a proper amount of borons in the activity layer of the GaN-based diode so as to modulate the band gap between the P type and N type layers. Thus, the light receiving ability of the GaN heterostructure photodiode will be promoted.

SUMMARY OF THE INVENTION

The main objective of the present invention is to provide a GaN-based heterostructure photodiode. A proper amount of borons are doped into the activity layer of the GaN-based diode so as to increase the band gap. Therefore, the breakdown voltage will be increased as the light receiving ability will be promoted so as to overcome the problems of the prior art photodiode where the band gap is so narrow that the breakdown voltage is small.

Another objective of the present invention is to provide a GaN-based heterostructure photodiode to be used as a light-receiving element having a better performance for light detection.

In order to achieve the mentioned objective, the present invention provides a GaN-based heterostructure photodiode comprising a P type layer and an N type layer positioned to be parallel and separated to each other and made of GaN-based compositions. Furthermore, an activity layer is positioned between the P type layer and the N type layer, made of GaN-based composition and doped with borons. The activity layer is used for modulating the band gap between the P type layer and the N type layer so as to increase the breakdown voltage.

According to the present invention, the mentioned activity layer is made of $B_xGa_{1-x}N$, and x<0.3. The activity layer also can be made of $B_xAl_yGa_{1-x}N$, and x<0.3, x+y=1.

According to the present invention, a substrate is further included, and the N type layer is formed on the substrate. The substrate is made of $Al_2O_3$. A buffer layer is formed between the substrate and the N type layer so that the lattice structures of the substrate and the N type layer are more matching.

According to the present invention, the buffer layer is made of GaN-based composition, and the buffer layer comprises a low temperature buffer layer formed under a low temperature and a high temperature buffer layer formed under a high temperature.

BRIEF DESCRIPTION OF THE DRAWINGS

The accompanying drawings, which are incorporated in and form part of the specification in which like numerals designate like parts, illustrate preferred embodiments of the present invention and together with the description, serve to explain the principles of the invention. In the drawings.

DETAILED DESCRIPTION OF THE PREFERRED EMBODIMENT

Figure 4:
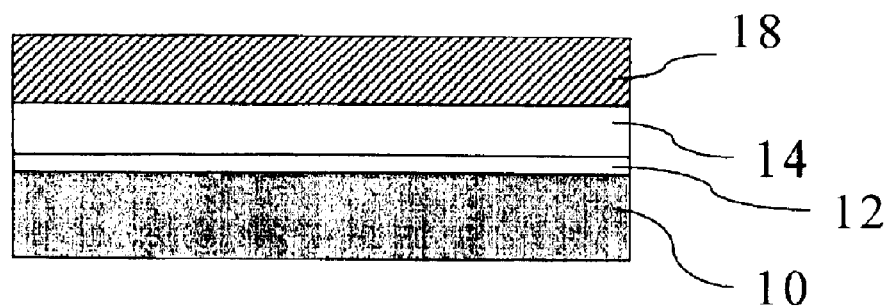
Figure 5:
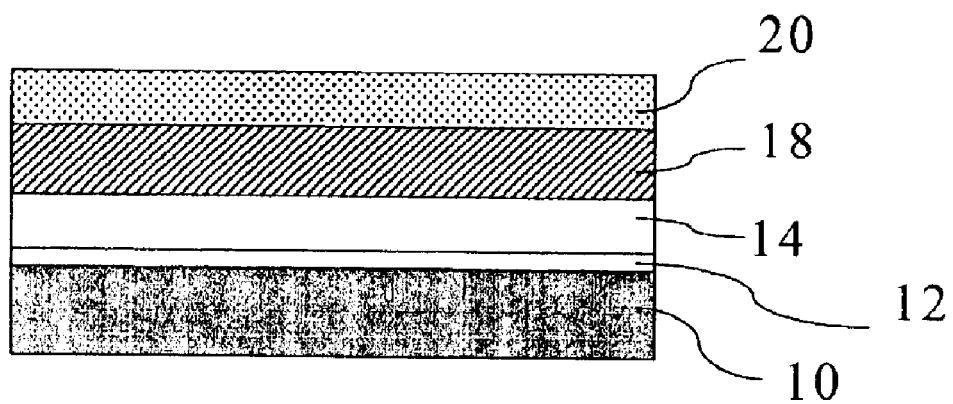
Figure 6:
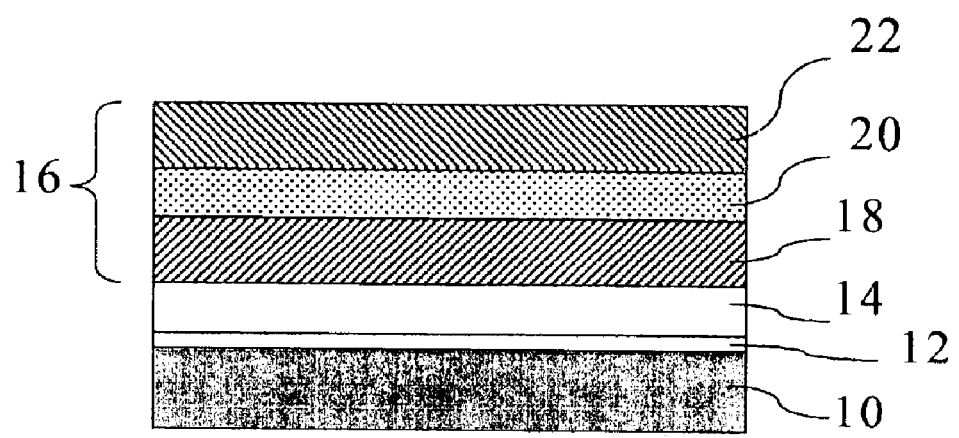

FIG. 1 to FIG. 6 are sectional views of the epitaxy structures of the GaN-based heterostructure photodiode in different manufacturing steps according to the present invention. Please refer to FIG. 6. FIG. 6 is a perspective diagram of the structure according to the present invention. The present invention discloses a GaN-based heterostructure photodiode comprising a substrate 10. On the substrate 10, a low temperature buffer layer 12 and a high temperature buffer layer 14 is sequentially formed. A PIN diode 16 is formed on the high temperature buffer layer 14, and the structure of the PIN diode 16 comprises an N type layer 18 and a P type layer 22 which are positioned to be parallel and separated to each other. The N type layer, the P type layer 18, 22 are made of GaN-based compositions. There is an activity layer 20 positioned between the N type layer 18 and the P type layer 22, and the activity layer 20 is made of GaN-based composition, and borons are doped in the activity layer 20. The activity layer 20 is used for absorbing the light. Namely, the activity layer 20 is the light receiving area of the PIN diode 16.

Figure 1:
FIG. 1 to FIG. 6 are sectional views of the structures of the GaN-based heterostructure photodiode in different manufacturing steps according to the present invention.
Figure 2:
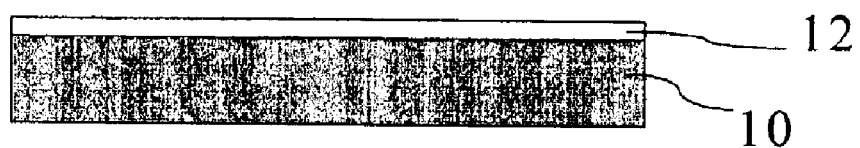
Figure 3:
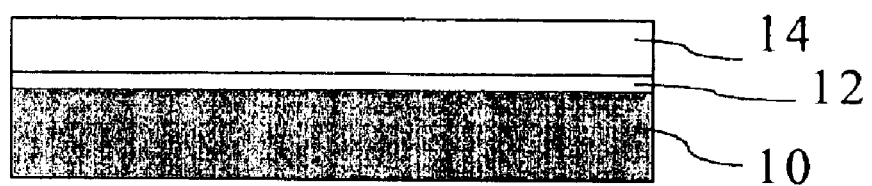

After the whole structure according to the present invention is described, the structure and the manufacturing method for each of the layers will be explained in details by referring to FIG. 1 to FIG. 6. First, as shown in FIG. 1, a substrate 10, made of $Al_2O_3$, is provided. Next, as shown in FIGS. 2 and 3, by employing a metal-organ chemical vapor deposition (MOCVD) method, the low temperature buffer layer 12 is produced from the epitaxy on the surface of the substrate 10 under a low temperature, and the temperature for the epitaxy is between 200° C. to 800° C. The range of 450° C. to 600° C. is preferred. And then the high temperature buffer layer 14 is formed on the low temperature buffer layer 12 under a high temperature, and the temperature for epitaxy is between 800° C. to 1100° C. The preferred is about 800° C. The mentioned low temperature buffer layer 12 and the high temperature buffer layer 14 are made of GaN-based compositions, generally GaN. The two buffer layers 12, 14 are so formed that the lattice structures of the N type layer 18 and the substrate 10 are more matching to reduce the crystal lattice mismatch degree among different crystal materials.

Based on different GaN-based composition semiconductors used for making the low temperature buffer layer 16 and the high temperature buffer layer 18, the MOCVD method is employed for forming the precursor of the epitaxy by using one of the groups composed of monomethyl hydrazine (MMH), trimethyl gallium (TMG), trimethy aluminum (TMAl), trimethy indium (TMIn) and $NH_3$. It is well known in the prior art how the precursor is reacted by the MOCVD method, and therefore, it will not be described herein.

After forming the low temperature buffer layer 12 and the high temperature buffer layer 14 on the substrate 10, as shown in FIG. 4, FIG. 5 and FIG. 6, a N type layer 18, an activity layer 20 and a P type layer 22 are sequentially formed on the high temperature buffer layer 14 so as to construct a structure for a PIN diode 16. The N type layer 18 and the P type layer 22 are made of GaN-based composition, GaN herein. The activity layer 20 is made of GaN-based composition and borons are doped in the activity layer 20. This activity layer 20 is made of the composition represented by the formula of $B_xGa_{1-x}N$, wherein x<0.3. Besides, this activity layer 20 also can be made of $B_xAl_yGa_{1-x}N$, wherein x<0.3, and x+y=1.

By doping a proper amount of borons in the activity layer 20, the band gap between the N type layer 18 and the P type layer 22 can be promoted so that the activity layer 20 has a greater breakdown voltage and therefore the light receiving ability of the can be promoted.

Therefore, the present invention is provided to dope a proper amount of borons in the activity layer of the GaN-based heterostructure photodiode so as to promote the band gap. As a result, the breakdown voltage for the activity layer can be increased and the light receiving ability can be promoted. After the accomplishing of the production, the GaN photodiode element is used as a light-receiving element and has a better performance for light detection.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A GaN-based heterostructure photodiode comprising:

a P type layer and a N type layer made of GaN-based compositions; and an activity layer positioned between said P type layer and said N type layer, said activity layer being made of GaN-based composition and borons being doped into said activity layer, said activity layer being used to modulate the band gap between said P type layer and said N type layer by said borons; wherein said activity layer is made of $B_xGa_{1-x}N$, and x<0.3.

2. A GaN-based heterostructure photodiode comprising:

a P type layer and a N type layer made of GaN-based compositions; and an activity layer positioned between said P type layer and said N type layer, said activity layer being made of GaN-based composition and barons being doped into said activity layer, said activity layer being used to modulate the band gap between said P type layer and said N type layer by said borons; wherein said activity layer is made of $B_xAl_yGa_{1-x}N$, and x<0.3, x+y=1.

3. A GaN-based heterostructure photodiode comprising:

a P type layer and a N type layer made of GaN-based compositions;

an activity layer positioned between said P type layer and said N type layer, said activity layer being made of GaN-based composition and borons being doped into said activity layer, said activity layer being used to modulate the band gap between said P type layer and said N type layer by said barons; and a substrate on which said N type layer is formed; wherein said substrate is made of $Al_2O_3$.

4. The GaN-based heterostructure photodiode of claim 3 further comprising a buffer layer formed between said substrate and said N type layer so that the lattice structures of the substrate and said N type layer are better matched, and wherein said buffer layer is made of GaN-based composition, and said buffer layer comprises a low temperature buffer layer formed under a low temperature and a high temperature buffer layer formed under a high temperature.

* * * * *